United States Patent
Kim et al.

(10) Patent No.: US 11,050,035 B2
(45) Date of Patent: *Jun. 29, 2021

(54) LIGHT EMITTING DIODE AND DISPLAY DEVICE INCLUDING THE SAME

(71) Applicant: SAMSUNG DISPLAY CO., LTD., Yongin-si (KR)

(72) Inventors: Dong Chan Kim, Yongin-si (KR); Won Jong Kim, Yongin-si (KR); Ji Young Moon, Yongin-si (KR); Dong Kyu Seo, Yongin-si (KR); Myung Chui Yeo, Yongin-si (KR); Ji Hye Lee, Yongin-si (KR); Yoon Hyeung Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/217,309

(22) Filed: Dec. 12, 2018

(65) Prior Publication Data

US 2019/0115557 A1    Apr. 18, 2019

Related U.S. Application Data

(63) Continuation of application No. 15/806,665, filed on Nov. 8, 2017, now Pat. No. 10,158,095.

(30) Foreign Application Priority Data

Feb. 15, 2017    (KR) .......................... 10-2017-0020537

(51) Int. Cl.
*H01L 29/08* (2006.01)
*H01L 51/50* (2006.01)
(Continued)

(52) U.S. Cl.
CPC ...... *H01L 51/5088* (2013.01); *H01L 27/3211* (2013.01); *H01L 27/3244* (2013.01);
(Continued)

(58) Field of Classification Search
CPC ............. H01L 27/3211; H01L 27/3244; H01L 51/504; H01L 51/5064; H01L 51/5092
(Continued)

(56) References Cited

U.S. PATENT DOCUMENTS 7,968,214 B2 * 6/2011 Noh .................... H01L 51/5044
                                                             428/690
8,274,212 B2 * 9/2012 Song ...................... H05B 33/18
                                                             313/504
(Continued)

FOREIGN PATENT DOCUMENTS

CN       105390522 A    3/2016
CN       105742513 A    7/2016
(Continued)

*Primary Examiner* — Tan N Tran
(74) *Attorney, Agent, or Firm* — Lewis Roca Rothgerber Christie LLP

(57) ABSTRACT

A light emitting diode includes a first electrode overlapping a second electrode, an emission layer between the first and second electrodes. a first hole injection layer and a second hole injection layer between the first electrode and the emission layer, and a first hole transporting layer between the first hole injection layer and the second hole injection layer. Each of the first and second hole injection layers includes an inorganic dipole material. At least one of the first hole injection layer or the second hole injection layer including an organic material.

19 Claims, 7 Drawing Sheets

(51) Int. Cl.
*H01L 27/32* (2006.01)
*H01L 51/52* (2006.01)

(52) U.S. Cl.
CPC ........ *H01L 51/504* (2013.01); *H01L 51/5064* (2013.01); *H01L 51/5092* (2013.01); *H01L 51/5218* (2013.01); *H01L 51/5234* (2013.01); *H01L 51/5256* (2013.01); *H01L 2251/301* (2013.01); *H01L 2251/5369* (2013.01)

(58) Field of Classification Search
USPC .................................................... 257/98, 40
See application file for complete search history.

(56) References Cited

U.S. PATENT DOCUMENTS

| | | | |
|---|---|---|---|
| 8,847,240 B2 | 9/2014 | Chung et al. | |
| 9,165,980 B2 | 10/2015 | Han et al. | |
| 9,660,214 B2 | 5/2017 | Kim et al. | |
| 10,158,095 B2* | 12/2018 | Kim | H01L 51/5088 |
| 2011/0028730 A1* | 2/2011 | Konemann | A61K 8/19 |
| | | | 548/101 |
| 2014/0191209 A1 | 7/2014 | Han et al. | |
| 2016/0056387 A1 | 2/2016 | Kim et al. | |
| 2016/0190501 A1 | 6/2016 | Kim et al. | |
| 2016/0351845 A1* | 12/2016 | Kim | H01L 51/5072 |
| 2018/0261784 A1* | 9/2018 | Wallikewitz | H01L 51/0077 |

FOREIGN PATENT DOCUMENTS

| | | |
|---|---|---|
| EP | 0 740 489 A | 10/1996 |
| EP | 1 901 363 A1 | 3/2008 |
| JP | 5170638 B2 | 3/2013 |
| KR | 10-0906782 B2 | 7/2009 |
| KR | 10-2013-0009141 A | 1/2013 |
| KR | 10-2014-0089258 A | 7/2014 |
| KR | 10-2016-0023992 A | 3/2016 |
| KR | 10-2016-0077617 A | 7/2016 |
| KR | 10-2016-0078782 A | 7/2016 |
| KR | 10-1733151 B1 | 4/2017 |
| TW | 201614892 A | 4/2016 |

* cited by examiner

LIGHT EMITTING DIODE AND DISPLAY DEVICE INCLUDING THE SAME

CROSS-REFERENCE TO RELATED APPLICATIONS

This is a continuation application based on pending application Ser. No. 15/806,665, filed Nov. 8, 2017, the entire contents of which is hereby incorporated by reference.

Korean Patent Application No. 10-2017-0020537, filed on Feb. 15, 2017, and entitled, "Light Emitting Diode and Display Device Including the Same," is incorporated by reference herein in its entirety.

BACKGROUND

1. Field

One or more embodiments described herein relate to a light emitting diode and a display device including a light emitting diode.

2. Description of the Related Art

A display made from light emitting diodes has as a wide viewing angle, fast response speed, reduced thickness, and low power consumption, and thus is suitable for use in televisions, monitors, and mobile phones. However, light emitting diodes have low emission efficiency. As a result, a high driving voltage may be applied to obtain high luminance. The high driving voltage may shorten the lifespan of the light emitting diode and its host display.

SUMMARY

In accordance with one or more embodiments, a light emitting diode, comprising a first electrode overlapping a second electrode; an emission layer between the first and second electrodes; a first hole injection layer and a second hole injection layer between the first electrode and the emission layer; and a first hole transporting layer between the first hole injection layer and the second hole injection layer, wherein each of the first hole injection layer and the second hole injection layer includes an inorganic dipole material, at least one of the first hole injection layer or the second hole injection layer including an organic material.

The first hole injection layer may be adjacent to the first electrode, and the second hole injection layer may be between the first hole transporting layer and the emission layer. The light emitting diode may include a second hole transporting layer between the second hole injection layer and the emission layer. The inorganic dipole material may include at least one of $CuI$, $AgI$, $AuI$, $ZnI_2$, $NiI_2$, $PdI_2$, $PtI_2$, $CoI_2$, $RhI_2$, $IrI_2$, $FeI_2$, $RuI_2$, $IrI_2$, $FeI_2$, $RuI_2$, $IrI_2$, $OsI_2$, $MnI_2$, $TcI_2$, $ReI_2$, $CrI_3$, $MoI_3$, $WI_3$, $VI_3$, $NbI_3$, $TaI_3$, $TiI_4$, $ZrI_4$, $HfI_4$, $SnI_2$, $SnI_4$, $GeI_2$, $GeI_4$, $CuBr$, $AgBr$, $AuBr$, $ZnBr_2$, $PdBr_2$, $PtBr_2$, $CoBr_2$, $RhBr_2$, $IrBr_2$, $FeBr_2$, $RuBr_2$, $OsBr_2$, $MnBr_2$, $TcBr_2$, $ReBr_2$, $CrBr_3$, $MoBr_3$, $WBr_3$, $VBr_3$, $NbBr_3$, $TaBr_3$, $TiBr_4$, $ZrBr_4$, $HfBr_4$, $CuCl$, $AgCl$, $AuCl$, $ZnCl_2$, $PdCl_2$, $PtCl_2$, $CoCl_2$, $RhCl_2$, $IrCl_2$, $FeCl_2$, $RuCl_2$, $OsCl_2$, $MnCl_2$, $TcCl_2$, $ReCl_2$, $CrCl_3$, $MoCl_3$, $WCl_3$, $VCl_3$, $NbCl_3$, $TaCl_3$, $TiCl_4$, $ZrCl_4$, $HfCl_4$, $CuF$, $AgF$, $AuF$, $ZnF_2$, $PdF_2$, $PtF_2$, $CoF_2$, $RhF2$, $IrF_2$, $FeF_2$, $RuF_2$, $OsF_2$, $MnF_2$, $TcF_2$, $ReF_2$, $CrF_3$, $MoF_3$, $WF_3$, $VF_3$, $NbF_3$, $TaF_3$, $TiF_4$, $ZrF_4$, $HfF_4$, or $BiI_3$.

Each of the first hole injection layer and the second hole injection layer may include an organic material and an inorganic dipole material, and the organic material of the first hole injection layer and the organic material of the second hole injection layer may be different from each other. The emission layer may emit white light by combining a plurality of layers.

The light emitting diode may include a charge generation layer between the plurality of layers and the charge generation layer includes the inorganic dipole material. The inorganic dipole material in the charge generation layer may be the same as inorganic dipole material in the first or second hole injection layer.

The light emitting diode may include an electron injection layer between the emission layer and the second electrode, and the electron injection layer includes at least one of a lanthanum element, a first element of an alkali metal, or a second element of a halogen. The electron injection layer may include at least one of: a) a dipole material having the lanthanum element and the second element having different polarities, b) a first compound made of the lanthanum element, the first element, and the second element and having a perovskite structure, c) a positive ion of the first element, or d) a monomolecular molecule including the lanthanum element.

In accordance with one or more other embodiments, a display device includes a substrate; a plurality of transistors on the substrate; and a first light emitting diode, a second light emitting diode, and a third light emitting diode respectively connected to the plurality of transistors, wherein each of the first light emitting diode, the second light emitting diode, and the third light emitting diode includes a first electrode, a second electrode overlapping the first electrode, an emission layer between the first electrode and the second electrode, and a hole transporting layer between the first electrode and the emission layer, and wherein: the first light emitting diode includes a first hole injection layer positioned between the first electrode and the hole transporting layer and a second hole injection layer between the hole transporting layer and the emission layer, each of the first hole injection layer and the second hole injection layer includes an inorganic dipole material, and at least one of the first hole injection layer or the second hole injection layer includes an organic material.

The substrate may include a red light emission region, a green light emission region, and a blue light emission region, and the first light emitting diode may be in the green light emission region. The second light emitting diode may be in the red light emission region, the second light emitting diode may include a third hole injection layer between the first electrode and the hole transporting layer and a fourth hole injection layer between the hole transporting layer and the emission layer, each of the third hole injection layer and the fourth hole injection layer may include an inorganic dipole material, and at least one of the third hole injection layer and the fourth hole injection layer may include an organic material.

The third hole injection layer may be connected to the first hole injection layer, and the fourth hole injection layer may be separated from the second hole injection layer. The third light emitting diode may be in the blue light emission region, and the third light emitting diode may include an auxiliary layer under an emission layer of the light emitting diode. The display device may include a green resonance auxiliary layer under the emission layer of the first light emitting diode, and a red resonance auxiliary layer under the emission layer of the second light emitting diode.

The inorganic dipole material may include at least one of $CuI$, $AgI$, $AuI$, $ZnI_2$, $NiI_2$, $PdI_2$, $PtI_2$, $CoI_2$, $RhI_2$, $IrI_2$, $FeI_2$, $RuI_2$, $IrI_2$, $FeI_2$, $RuI_2$, $IrI_2$, $OsI_2$, $MnI_2$, $TcI_2$, $ReI_2$, $CrI_3$, $MoI_3$, $WI_3$, $VI_3$, $NbI_3$, $TaI_3$, $TiI_4$, $ZrI_4$, $HfI_4$, $SnI_2$, $SnI_4$, $GeI_2$, $GeI_4$, CuBr, AgBr, AuBr, $ZnBr_2$, $PdBr_2$, $PtBr_2$, $CoBr_2$, $RhBr_2$, $IrBr_2$, $FeBr_2$, $RuBr_2$, $OsBr_2$, $MnBr_2$, $TcBr_2$, $ReBr_2$, $CrBr_3$, $MoBr_3$, $WBr_3$, $VBr_3$, $NbBr_3$, $TaBr_3$, $TiBr_4$, $ZrBr_4$, $HfBr_4$, CuCl, AgCl, AuCl, $ZnCl_2$, $PdCl_2$, $PtCl_2$, $CoCl_2$, $RhCl_2$, $IrCl_2$, $FeCl_2$, $RuCl_2$, $OsCl_2$, $MnCl_2$, $TcCl_2$, $ReCl_2$, $CrCl_3$, $MoCl_3$, $WCl_3$, $VCl_3$, $NbCl_3$, $TaCl_3$, $TiCl_4$, $ZrCl_4$, $HfCl_4$, CuF, AgF, AuF, $ZnF_2$, $PdF_2$, $PtF_2$, $CoF_2$, $RhF2$, $IrF_2$, $FeF_2$, $RuF_2$, $OsF_2$, $MnF_2$, $TcF_2$, $ReF_2$, $CrF_3$, $MoF_3$, $WF_3$, $VF_3$, $NbF_3$, $TaF_3$, $TiF_4$, $ZrF_4$, $HfF_4$, or $BiI_3$.

Each of the first hole injection layer and the second hole injection layer may include the organic material and the inorganic dipole material, and the organic material of the first hole injection layer and the organic material of the second hole injection layer may be different from each other. The display device may include an electron injection layer between the emission layer and the second electrode, and the electron injection layer includes at least one of a lanthanum element, a first element of an alkali metal, or a second element of a halogen.

The electron injection layer may include at least one of: a) a dipole material having the lanthanum element and the second element having different polarities, b) a first compound made of the lanthanum element, the first element, and the second element and having a perovskite structure, c) a positive ion of the first element, and d) a monomolecular molecule including the lanthanum element.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
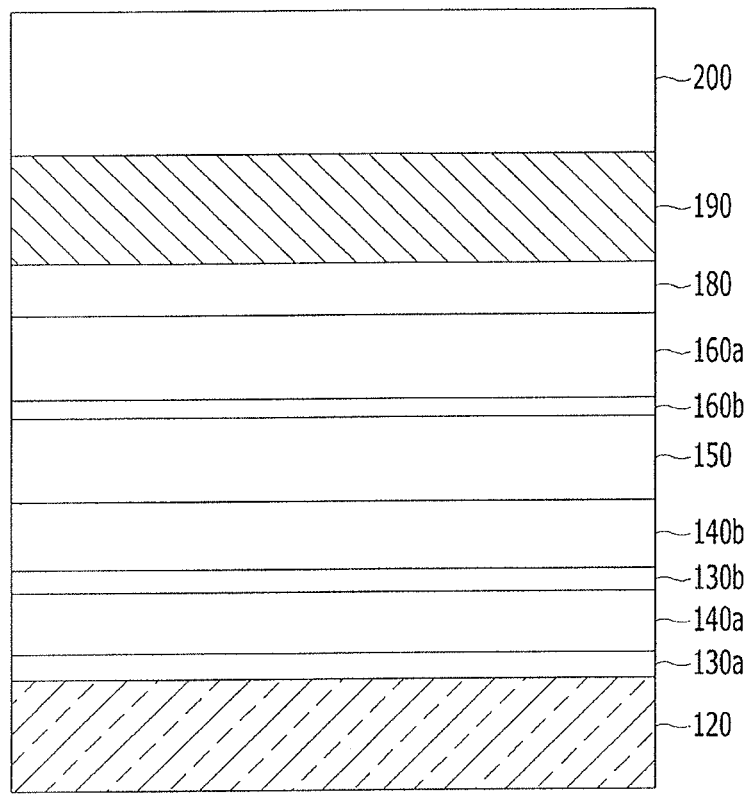
FIG. 1 illustrates an embodiment of a light emitting diode.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 2:
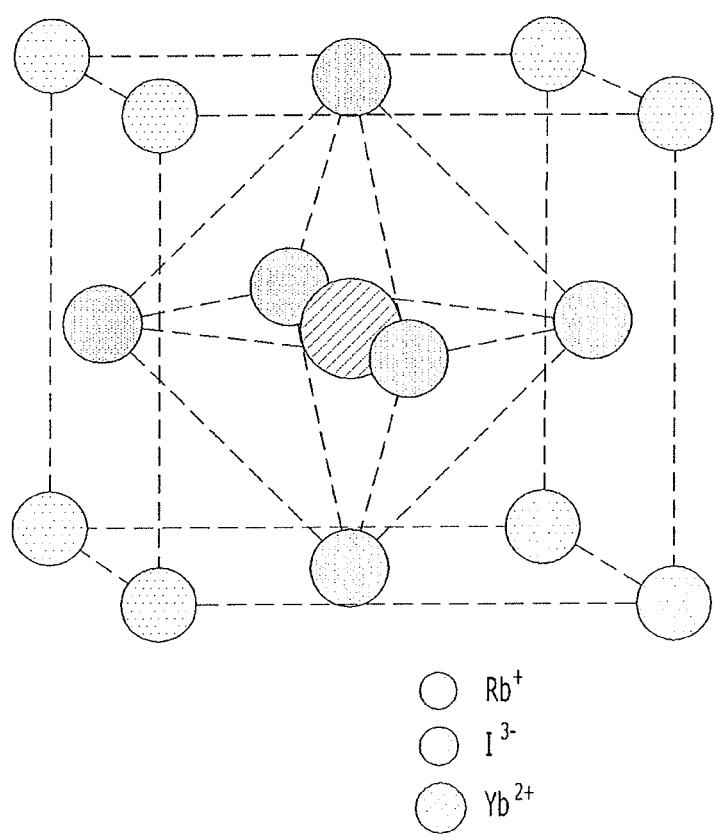
FIG. 2 illustrates an embodiment of a perovskite structure.

FIG. 1 illustrates an embodiment of a light emitting diode, and FIG. 2 illustrates an embodiment of a perovskite structure. Referring to FIG. 1, the light emitting diode includes a first electrode 120 overlapping a second electrode 190, an emission layer 150 between the first electrode 120 and the second electrode 190, a first hole injection layer 130a between the first electrode 120 and the emission layer 150, a first hole transporting layer 140a on the first hole injection layer 130a, a second hole injection layer 130b between the first hole transporting layer 140a and the emission layer 150, a second hole transporting layer 140b between the second hole injection layer 130b and the emission layer 150, an electron transporting layer 160a between the emission layer 150 and the second electrode 190, a buffer layer 160b between the emission layer 150 and the electron transporting layer 160a, an electron injection layer 180 between the electron transporting layer 160a and the second electrode 190, and a capping layer 200 on the second electrode 190.

The first electrode 120 may be a reflecting electrode, e.g., an electrode including a material that reflects light emitted from the emission layer 150 for transmission to the second electrode 190. For example, the material of the reflecting electrode may reflect incident light by about 70% or more to about 100% or less, or about 80% or more to about 100% or less.

The first electrode 120 may include silver (Ag), aluminum (Al), chromium (Cr), molybdenum (Mo), tungsten (W), titanium (Ti), gold (Au), palladium (Pd), or alloys thereof, which may be used as the reflection layer while having the anode function. In one embodiment, the first electrode 120 may have a triple layer structure of, for example, silver (Ag)/indium tin oxide (ITO)/silver (Ag) or indium tin oxide (ITO)/silver (Ag)/indium tin oxide (ITO).

The first electrode 120 may be formed, for example, by a sputtering method, a vapor phase deposition method, an ion beam deposition method, or an electron beam deposition method.

The first hole injection layer 130a facilitates injection of holes from the first electrode 120. The first hole transporting layer 140a performs a function of smoothly transporting the holes from the first hole injection layer 130a. The second hole injection layer 130b allows the holes from the first hole transporting layer 140a to be injected to the second hole transporting layer 140b. The second hole transporting layer 140b may control a resonance distance while transmitting the holes injected from the second hole injection layer 130b to the emission layer 150.

The first hole injection layer 130a is adjacent to the first electrode 120 on the first electrode 120 and includes an inorganic dipole material. The inorganic dipole material may be an inorganic ion compound of a first component and a second component of different polarities. The first component may be an element that becomes a positive ion when the inorganic ion compound is ionized. The second component may be an element that becomes a negative ion. The first component may be a transition metal, and the second component may include a halogen.

The inorganic dipole material may be, for example, at least one of CuI, AgI, AuI, ZnI$_2$, NiI$_2$, PdI$_2$, PtI$_2$, CoI$_2$, RhI$_2$, IrI$_2$, FeI$_2$, RuI$_2$, IrI$_2$, FeI$_2$, RuI$_2$, IrI$_2$, OsI$_2$, MnI$_2$, TcI$_2$, ReI$_2$, CrI$_3$, MoI$_3$, WI$_3$, VI$_3$, NbI$_3$, TaI$_3$, TiI$_4$, ZrI$_4$, HfI$_4$, SnI$_2$, SnI$_4$, GeI$_2$, GeI$_4$, CuBr, AgBr, AuBr, ZnBr$_2$, PdBr$_2$, PtBr$_2$, CoBr$_2$, RhBr$_2$, IrBr$_2$, FeBr$_2$, RuBr$_2$, OsBr$_2$, MnBr$_2$, TcBr$_2$, ReBr$_2$, CrBr$_3$, MoBr$_3$, WBr$_3$, VBr$_3$, NbBr$_3$, TaBr$_3$, TiBr$_4$, ZrBr$_4$, HfBr$_4$, CuCl, AgCl, AuCl, ZnCl$_2$, PdCl$_2$, PtCl$_2$, CoCl$_2$, RhCl$_2$, IrCl$_2$, FeCl$_2$, RuCl$_2$, OsCl$_2$, MnCl$_2$, TcCl$_2$, ReCl$_2$, CrCl$_3$, MoCl$_3$, WCl$_3$, VCl$_3$, NbCl$_3$, TaCl$_3$, TiCl$_4$, ZrCl$_4$, HfCl$_4$, CuF, AgF, AuF, ZnF$_2$, PdF$_2$, PtF$_2$, CoF$_2$, RhF2, IrF$_2$, FeF$_2$, RuF$_2$, OsF$_2$, MnF$_2$, TcF$_2$, ReF$_2$, CrF$_3$, MoF$_3$, WF$_3$, VF$_3$, NbF$_3$, TaF$_3$, TiF$_4$, ZrF$_4$, HfF$_4$, or BiI$_3$.

The first component may have a predetermined work function, e.g., 4.3 eV or more. By disposing the first hole injection layer 130a with a strong dipole characteristic at an interface of the first electrode 120 of the inorganic material and the first hole transporting layer 140a of the organic material layer, the vacuum level of the organic material layer may shift so that a hole injection barrier decreases. The electric field increases at the interface to allow for tunneling of holes.

For example, when a dipole material of a metal or a non-metal having a work function of 4.3 eV or more (a high work function) and a halogen dissociates on the interface, the carrier injection barrier including a hole is decreased by the metal having a high work function. When the metal having a high work function oxidizes and captures electrons on the interface, holes are formed in the organic material layer by separation of the electrons and a p-doped interface region is formed. As a result, a hole injection layer is formed. Halogen ions dissociated from the dipole material prevent In and Sn ions in ITO of the first electrode 120 from moving to the organic material layer. Thus, it is possible to prevent crystallization of the organic material layer due to the In and Sn ions. In addition, pin-holes formed on the surface of ITO are covered to allow for a reduction in the size of any bulge that may form due to bonding of Ag and S in the atmosphere.

In the present exemplary embodiment, the first hole injection layer 130a may further include the organic material in a first hole transporting layer 140a. For example, the first hole injection layer 130a may include NPD (N,N-dinaphthyl-N,N'-diphenyl benzidine), TPD (N,N'-bis-(3-methylphenyl)-N,N'-bis-(phenyl)-benzidine), s-TAD, or MTDATA (4,4',4"-tris(N-3-methylphenyl-N-phenyl-amino)-triphenylamine). The first hole injection layer 130a may be in a state such that the inorganic dipole material is doped to the organic material.

The first hole transporting layer 140a may include the organic material. For example, the first hole transporting layer 140a may include NPD (N,N-dinaphthyl-N,N'-diphenyl benzidine), TPD (N,N'-bis-(3-methylphenyl)-N,N'-bis-(phenyl)-benzidine), s-TAD, or MTDATA (4,4',4"-tris(N-3-methylphenyl-N-phenyl-amino)-triphenylamine). The thickness of the first hole transporting layer 140a may be greater than the thickness of the first hole injection layer 130a.

The second hole injection layer 130b is on the first hole transporting layer 140a. The second hole injection layer 130b includes an inorganic dipole material, such as previously described relative to the first hole injection layer 130a. The second hole injection layer 130b may further include an organic material, such as previously described relative to the first hole injection layer 130a. The second hole injection layer 130b may be made of the same or a different material from the first hole injection layer 130a. When the second hole injection layer 130b and the first hole injection layer 130a are made of different materials, the organic material of the first hole injection layer 130a may be different from the organic material of the second hole injection layer 130b.

The second hole transporting layer 140b is on the second hole injection layer 130b and may include organic material. For example, the second hole transporting layer 140b may include NPD (N,N-dinaphthyl-N,N'-diphenyl benzidine), TPD (N,N'-bis-(3-methylphenyl)-N,N'-bis-(phenyl)-benzidine), s-TAD, or MTDATA (4,4',4"-tris(N-3-methylphenyl-N-phenyl-amino)-triphenylamine). The thickness of the second hole transporting layer 140b may be greater than the thickness of the second hole injection layer 130b.

The emission layer 150 is on the second hole transporting layer 140b and includes a light emitting material displaying a particular color. For example, the emission layer 150 may display a primary color such as blue, green, or red, or a combination thereof. The thickness of the emission layer 150 may be in a predetermined range, e.g., 10 nm to 50 nm. The emission layer 150 includes a host and a dopant. The emission layer 150 may contain materials for emitting red, green, blue, and white light, and may be formed using, for example, a phosphorescent or fluorescent material.

When the emission layer 150 emits red light, the emission layer 150 includes a host material that includes CBP (carbazole biphenyl) or mCP (1,3-bis(carbazol-9-yl)), and may be formed of a phosphorescent material including at least one of PIQIr(acac) (bis(1-phenylisoquinoline)acetylacetonate iridium), PQIr(acac) (bis(1-phenylquinoline)acetylacetonate iridium), PQIr (tris(1-phenylquinoline)iridium), and PtOEP (platinum octaethylporphyrin), or a fluorescent material including PBD:Eu(DBM)3(phen) or perylene.

When the emission layer 150 emits green light, the emission layer 150 includes a host material including CBP or mCP. In this case, the emission layer 150 may include, for example, a phosphorescent material including a dopant material such as Ir(ppy)3 (fac-tris(2-phenylpyridine) iridium) or a fluorescent material including Alq3 (tris(8-hydroxyquinolino)aluminum).

When the emission layer 150 emits blue light, the emission layer 150 includes a host material including CBP or mCP. In this case, the emission layer 150 may include a phosphorescent material including a dopant that includes (4,6-F2ppy)2Irpic. In one embodiment, the emission layer 150 may include a host material having an anthracene group. In this case, emission layer 150 may include a fluorescent material including the dopant including a diamine group or at least one of spiro-DPVBi, spiro-6P, distyrylbenzene (DSB), distyrylarylene (DSA), a PFO-based polymer, or a PPV-based polymer.

Also, as above-described in the present exemplary embodiment, it is not essential for the emission layer 150 to be formed of the organic material. The emission layer 150 may include, for example, an inorganic material such as a quantum dot.

The electron transport layer 160a and the electron injection layer 180 are between the emission layer 150 and the second electrode 190. The electron transport layer 160a is adjacent to the emission layer 150, and the electron injection layer 180 is adjacent to the second electrode 190. The buffer layer 160b may be between the emission layer 150 and the electron transporting layer 160a. In one embodiment, the buffer layer 160b may be omitted.

The electron transporting layer 160a may include organic material. For example, electron transporting layer 160a may include Alq3 (tris(8-hydroxyquinolino)aluminum), PBD (2-

[4-biphenyl-5-[4-tert-butylphenyl]]-1,3,4-oxadiazole), TAZ (1,2,4-triazole), spiro-PBD (spiro-2-[4-biphenyl-5-[4-tert-butylphenyl]]-1,3,4-oxadiazole), or BAlq(8-hydroxyquinoline beryllium salt).

The electron transport layer 160a may transmit the electrons from the second electrode 190 to the emission layer 150. Also, the electron transport layer 160a may prevent holes injected from the first electrode 120 from moving into the second electrode 190 through the emission layer 150. For example, the electron transport layer 160 may perform the function of a hole blocking layer, and may help the holes and the electrons in the emission layer 150 to combine.

The electron injection layer 180 may improve electron injection from the second electrode 190 to the electron transport layer 160. In the present exemplary embodiment, the thickness of the electron injection layer 180 may be in a predetermined range, e.g., about 2 Å to 25 Å taking into consideration a process margin. In the one embodiment, the electron injection layer 180 includes a lanthanum group element, a first element of an alkali metal, and/or a second element of a halogen.

The electron injection layer 180 may be formed by codepositing a first material including metal and a second material including metal halide. The first material and the second material are selected from materials that react with each other to cause a substitution reaction. For example, when the first material made of Yb of a lanthanum group element and the second material made of KI of a metal halide are codeposited, a substitution reaction such as Reaction Formula 1, Reaction Formula 2, or Reaction Formula 3 may be generated.

$$2KI+Yb \rightarrow YbI_2+2K^++2e- \text{ or } YbI_2+2K \quad \text{Reaction Formula 1}$$

$$3KI+Yb \rightarrow YbI_3+3K^++3e- \text{ or } YbI_3+3K \quad \text{Reaction Formula 2}$$

$$3KI+Yb \rightarrow KYbI_3+2K^++2e- \text{ or } KYbI_3+2K \quad \text{Reaction Formula 3}$$

In the present exemplary embodiment, the first material and the second material may include metals having similar standard electrode potentials. For example, when the first material and the second material respectively include any one among a Group 1 element, a Group 2 element, and the lanthanum group element, a spontaneous reaction may be caused depending on strong reactivity, for example, through an experimental example discussed below.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Experimental Example

The first material is made of the lanthanum group such as Yb, Eu, or Sm. The second material is made of the metal iodine such as KI, RbI, or CsI. The first and second materials are combined and codeposited through the experimental example, and the first material and the second material react to form a layer.

As the layer becomes transparent, conductivity increases. However, when the first material made of Ag and the second material made of the metal iodine such as KI, RbI, or CsI are combined and codeposited to form the layer, the layer is not transparent and the conductivity is not increased. Also, when the first material made of the lanthanum group such as Yb, Eu, or Sm and the second material made of CuI are codeposited to form the layer, the layer is not transparent and conductivity is not increased. Accordingly, the metals in the first material and the second material are materials having high reactivity to induce the spontaneous reaction.

Among the halide compounds, an iodine compound has low electron affinity of the iodine itself and low electronegativity. Thus, it is relatively easy for the iodine compound to be dissociated to form an iodine vacancy or be combined with other reactive metals to generate a new compound. Accordingly, electron injection characteristics may be improved by compounds generated by a substitution reaction of the first material made of the metal and the metal iodine including the iodine.

Also, since iodine has a small refractive index difference with organic material compared to fluorine, such an embodiment may be suitable for optical design. Further, since iodine has a low thermal evaporation temperature compared to the material such as fluorine, process characteristics may be improved. In addition, when fluorine is pyrolyzed, gas is emitted such that a vacuum degree may decrease. However, even when heat is applied to iodine, there is no problem of the vacuum degree decreasing by a remaining solid.

In this example, the experiment is executed for the iodine compound among the halide compound. However, a result similar to that of metal iodine appears when using the metal halide such as KCl, KBr, RbCl, RbBr, CsCl, or CsBr as the second material.

A conduction mechanism will be described below.

In the present exemplary embodiment, the metal in the first material and the metal in the second material may be substituted with each other. In this case, the valence electron number of the metal in the first material may be greater than or equal to the valence electron number of the metal in the second material. When the valence electron number of the metal in the first material is greater than the valence electron number of the metal in the second material, the conductivity due to the free electrons that are additionally generated may be improved.

Also, when the halogen elements in the second material are moved in the first material to form a new material, the free electrons are formed depending on a halogen vacancy, such that conductivity may be improved. Further, conductivity may be improved by the remaining metal ions that participate in the reaction.

In the present exemplary embodiment, the electron injection layer 180 may include a first compound made of the metal of the first material and a dipole material made of the halogen in the second material and/or the metal of the first material and the metal halide of the second material. In this case, the dipole material may include at least one of a compound including the lanthanum group element as a bivalent element or a compound including the lanthanum group element as a trivalent element.

In the present exemplary embodiment, the metal of the first material may be the lanthanum group element having a work function of about 2.7 eV or less. As the lanthanum group element, ytterbium (Yb) having a work function of 2.6 eV, samarium (Sm) having a work function of 2.7 eV, or europium (Eu) having a work function of 2.5 eV may be used.

Among the lanthanum group elements, ytterbium (Yb), samarium (Sm), and europium (Eu) have low ionization energy and a low ion radius. Thus, they may be easily reacted with the alkali halide material and may be easily diffused in the alkali halide material. Accordingly, ytterbium (Yb), samarium (Sm), and europium (Eu) are easily reacted with KI, RbI, or CsI such that a reactant of a perovskite structure, and the alkali metal or the ion, remain, thereby smoothly lowering an injection barrier.

The first compound may have a perovskite structure. The perovskite structure may be made of the lanthanum group element, the first element of the alkali metal, and the second element of the halogen. Referring to the above-described Reaction Formulas 1, 2, and 3, the electron injection layer 180 may include a positive ion of the first element and a free electron as well as the described dipole material and the first compound having the perovskite structure.

In the present exemplary embodiment, the electron injection layer 180 may be formed by codepositing the first material made of the lanthanum group metal and the second material made of the alkali metal halide. Content of the second material in an entire content including the first material and the second material may be in a predetermined range, e.g., from about 1 vol % to about 20 vol %. If it is described based on the electron injection layer 180 as a final product, among the entire material having the lanthanum group element, the first element, and the second element, a sum of the material having the first element and the material having the second element may have a predetermined range, e.g., from about 1 vol % to about 20 vol %.

Since more of the first material having the lanthanum group element is present than the second material, the electron injection layer 180 may include a monomolecular molecule including the lanthanum group element.

The first material may be, for example, Yb, Eu, or Sm. The second material may be, for example, KI, RbI, or CsI. When RbI and Yb are codeposited, a chemical reaction is generated such that at least one among $YbI_2$, $YbI_3$, and $RbYbI_3$ may be generated. Here, $RbYbI_3$, as shown in FIG. 2, may have the perovskite structure. In this way, even when a chemical reaction is generated, the remaining material may exist as RbI and Yb.

The electron injection layer 180 according to the present exemplary embodiment may be a single layer structure in which the first material and the second material are codeposited. If more of the first material is distributed than the second material in the electron injection layer 180, conductivity relatively increases and transmittance may decrease compared with the opposite case.

Accordingly, in the present exemplary embodiment, the volume at which the first material and the second material are distributed may be optimized (or may achieve a predetermined level) by considering the sheet resistance and transmittance for operating the light emitting diode.

Figure 3:
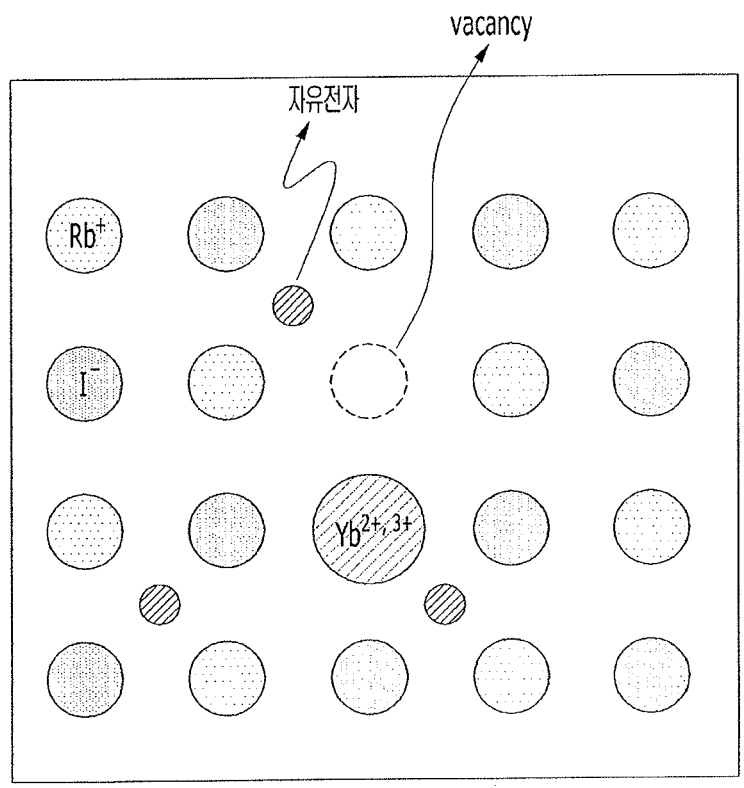
FIG. 3 illustrates an embodiment of an electron injection layer.

FIG. 3 illustrates an embodiment of an electron injection layer having a free electron. Referring to FIG. 3, one layer may be formed using ytterbium (Yb) in the first material and RbI in the second material. Ytterbium (Yb) and RbI are reacted to form the conductor, e.g., Rb and Yb are substituted with each other. As a result, a free electron may form somewhere in the reactant. The free electron may be formed by an iodine vacancy generated depending on the $YbI_2$ or $YbI_3$ compound. In this way, because of the free electron formed by RbI (that is one kind of the metal halide) and/or the free electron formed by the iodine vacancy, and the metal ion, the electron injection layer 180 according to the present exemplary embodiment may have conductivity which allows the electron injection speed to be very fast. Although RbI is described as the metal halide in FIG. 3, another material (e.g., KI or CsI) may be equally applied.

Next, an increase in lifespan due to a decrease in driving voltage when the content of the first material having the lanthanum group element and the second material having the codeposited alkali metal halide is in the range of 1 vol % to 20 vol % will be described with reference to Table 1.

In Table 1, Exemplary Embodiment 1 represents forming the electron injection layer by codepositing ytterbium (Yb) and RbI with a volume ratio of 9:1. Exemplary Embodiment 2 represents forming the electron injection layer by codepositing ytterbium (Yb) and KI with a volume ratio of 9:1. Table 1 is a result of evaluating white/red/green/blue light efficiency depending on time for about 240 h at 85° C. for Exemplary Embodiment 1 and Exemplary Embodiment 2.

Referring to Table 1, an increasing width of the driving voltage according to Exemplary Embodiments 1 and 2 is not large, but the driving voltage is mainly reduced.

In this way, in the exemplary embodiment, power efficiency is improved by 17% to 26% due to the driving voltage reduction. Accordingly, lifespan may be improved. A condition corresponding to 85° C. may be an environment similar to when a car is exposed to strong sunlight. Accordingly, when the light emitting diode according to an exemplary embodiment is applied to a car, there is an effect that the driving voltage is maintained and the lifespan is improved at the high temperature.

TABLE 1

| Example (time) | Driving voltage (V) | | | |
| --- | --- | --- | --- | --- |
| | W | R | G | B |
| Exemplary Embodiment 1 (0 h) | 2.66 | 2.5 | 1.67 | 1.56 |
| Exemplary Embodiment 1 120 h | 2.65 | 2.01 | 1.48 | 1.47 |
| Exemplary Embodiment 1 240 h | 2.52 | 2.27 | 1.68 | 1.5 |
| Exemplary Embodiment 2 (0 h) | 2.46 | 2.26 | 1.71 | 1.64 |
| Exemplary Embodiment 2 120 h | 2.29 | 2.06 | 1.45 | 1.42 |
| Exemplary Embodiment 2 240 h | 2.55 | 2.05 | 1.63 | 1.46 |

Hereinafter, light efficiency and reliability of the element depending on volume ratio of the first material having the lanthanum group element and the second material having the alkali metal halide will be described.

Table 2 is a case in which Comparative Example 1-1 forms the electron injection layer with ytterbium (Yb). Exemplary Embodiment 1-1 to Exemplary Embodiment 1-6 form the electron injection layer by codepositing ytterbium (Yb) and KI in the light emitting diode including the electron transport layer including Liq and a negative electrode including AgMg. In Exemplary Embodiment 1-1 to Exemplary Embodiment 1-6, the content of K in the electron injection layer is 1 vol %, 3 vol %, 5 vol %, 10 vol %, 15 vol %, and 20 vol %, respectively. Numbers of Table 2 are values corresponding to an average of efficiencies of 30 panels for each condition.

TABLE 2

| | R efficiency | G efficiency | B efficiency | W efficiency |
| --- | --- | --- | --- | --- |
| Comparative Example 1-1 | 37.4 | 53.8 | 4.973 | 29.9 |
| Exemplary Embodiment 1-1 | 38.3 | 56.3 | 5.131 | 31.2 |
| Exemplary Embodiment 1-2 | 38.6 | 56.8 | 5.179 | 31.2 |
| Exemplary Embodiment 1-3 | 39.1 | 57.1 | 5.218 | 31.2 |
| Exemplary Embodiment 1-4 | 38.9 | 59.0 | 5.360 | 31.7 |
| Exemplary Embodiment 1-5 | 39.6 | 59.0 | 5.467 | 31.9 |
| Exemplary Embodiment 1-6 | 38.3 | 59.1 | 5.492 | 32.0 |

Table 3 shows, for the light emitting diode including the electron transport layer including Liq and the negative electrode formed of AgYb, the case where Comparative Example 1-1 forms the electron injection layer of ytterbium (Yb). Exemplary Embodiment 2-1 to Exemplary Embodiment 2-6 form the electron injection layer by codepositing ytterbium (Yb) and KI. In Exemplary Embodiment 2-1 to Exemplary Embodiment 2-6, the content of KI in the electron injection layer is 1 vol %, 3 vol %, 5 vol %, 10 vol %, 15 vol %, and 20 vol %, respectively.

TABLE 3

|  | R efficiency | G efficiency | B efficiency | W efficiency |
|---|---|---|---|---|
| Comparative Example 1-1 | 37.4 | 53.8 | 4.973 | 29.9 |
| Exemplary Embodiment 2-1 | 37.7 | 55.2 | 5.096 | 31.2 |
| Exemplary Embodiment 2-2 | 38.0 | 56.5 | 5.230 | 31.4 |
| Exemplary Embodiment 2-3 | 38.6 | 57.1 | 5.142 | 31.2 |
| Exemplary Embodiment 2-4 | 38.9 | 57.7 | 5.291 | 31.2 |
| Exemplary Embodiment 2-5 | 38.7 | 58.9 | 5.564 | 31.7 |
| Exemplary Embodiment 2-6 | 37.4 | 60.3 | 5.469 | 32.1 |

Referring to Table 2 and Table 3, compared with Comparative Example 1-1, in the case of Exemplary Embodiment 1-1 to Exemplary Embodiment 1-6, and Exemplary Embodiment 2-1 to Exemplary Embodiment 2-6, there is an effect that the white light efficiency is increased by about 4% to 7%.

Table 4 shows a result of estimating the reliability of the display panel including the light emitting diode depending on the volume ratio of the two codeposited materials when codepositing ytterbium (Yb) and RbI to form the electron injection layer and codepositing ytterbium (Yb) and KI to form the electron injection layer.

TABLE 4

| Electron injection layer | Volume ratio (vol %) | Reliability | Electron injection layer | Volume ratio (vol %) | Reliability |
|---|---|---|---|---|---|
| Yb:RbI | 9:1 | Good | Yb:KI | 9:1 | Good |
| Yb:RbI | 8:2 | Good | Yb:KI | 8:2 | Good |
| Yb:RbI | 7:3 | Bad | Yb:KI | 7:3 | Bad |
| Yb:RbI | 5:5 | Bad | Yb:KI | 5:5 | Bad |
| Yb:RbI | 3:7 | Bad | Yb:KI | 3:7 | Bad |
| Yb:RbI | 1:9 | Bad | Yb:KI | 1:9 | Bad |
| RbI alone | — | Bad | KI alone | — | Bad |

Referring to Table 4, in the case that the volume ratio of ytterbium (Yb) and RbI is 9:1 and 8:2, the display panel is normally operated. If the content of RbI is over 20 vol %, a phenomenon such as a pattern stain is generated such a defect rate of the display panel may be high.

In the ratio of Yb and KI, as KI increases, more of the perovskite structure is formed in the reactor. Because the perovskite very sensitively reacts to a magnetic field generated in a magnetic jig of an opening aligning device, a pattern stain such as one formed by the magnetic jig is generated in the surface during a deposition process. In the case of the perovskite structure, because the perovskite structure has a high dielectric constant of about 10 times or more that of a binary compound, the perovskite structure may sensitively react to the magnetic field change.

As above-described, in the light emitting diode according to the present embodiment, the content of the first material having the lanthanum group element and the second material having the codeposited alkali metal halide is in the range of 1 vol % to 20 vol % in the perspective of reliability and light efficiency.

Referring again to FIG. 1, the second electrode 190 is on the electron injection layer 180. The second electrode 190 may be a transflective electrode, e.g., an electrode including a material having a transflective characteristic transmitting part of light incident to the second electrode 190 and reflecting a remaining part of the light to the first electrode 120. The transflective characteristic may correspond to the case where reflectivity for the incident light is in a predetermined range, e.g., about 0.1% or more to about 70% or less, or about 30% or more to about 50% or less.

The second electrode 190 may include silver (Ag), magnesium (Mg), aluminum (Al), chromium (Cr), molybdenum (Mo), tungsten (W), titanium (Ti), gold (Au), palladium (Pd), ytterbium (Yb), or alloys thereof. Above, it is described that the second electrode 190 is the transflective electrode as one example to explain a resonance structure. However, a non-resonance structure may also be applied according to another exemplary embodiment. In this case, the second electrode 190 may be a transparent conductive electrode such as ITO or IZO.

When the above-described second electrode 190 is formed of the alloy, an alloy ratio may be controlled by the temperature of a deposition source, the atmosphere, and/or the vacuum degree. The allow ratio may therefore be set to an appropriate or predetermined ratio. In the present exemplary embodiment, the second electrode 190 may have a predetermined thickness, e.g., about 50 Å to about 150 Å. If the thickness of the second electrode 190 is less than 50 Å, it may be difficult to obtain the sheet resistance. If the thickness is greater than 150 Å, reflectance is increased and a wide angle distribution (WAD) may not result. Consequently, a color change may be when viewed from the side.

In the present exemplary embodiment, the second electrode 190 may be formed of AgMg or AgYb. When applying the AgMg or AgYb electrode, the electron injection barrier decreases as the content of Mg or Yb increases. As a result, many electrons may be injected. When an electron-hole balance in the whole device is changed, degradation is generated in a way that will sharply reduce lifespan and efficiency. By considering the electron-hole balance, the content of Mg or Yb in the second electrode 190 is in a predetermined range, e.g., about 10 vol % to about 30 vol %.

When comparing the AgMg electrode and the AgYb electrode, because of high ignitability in the case of Mg, AgYb may be used to address environmental and safety concerns. Also, because Yb is in the electron injecting layer, AgYb may be used to improve process and cost concerns, compared with AgMg electrode manufacturing. This is because the number of materials for AgYb electrode manufacturing is less.

The capping layer 200 is on the second electrode 190, may include organic material or inorganic material, and may perform the function of protecting the second electrode 190 or guiding a change of resonance intensity and resonance phase along with the second electrode 190.

Figure 4:
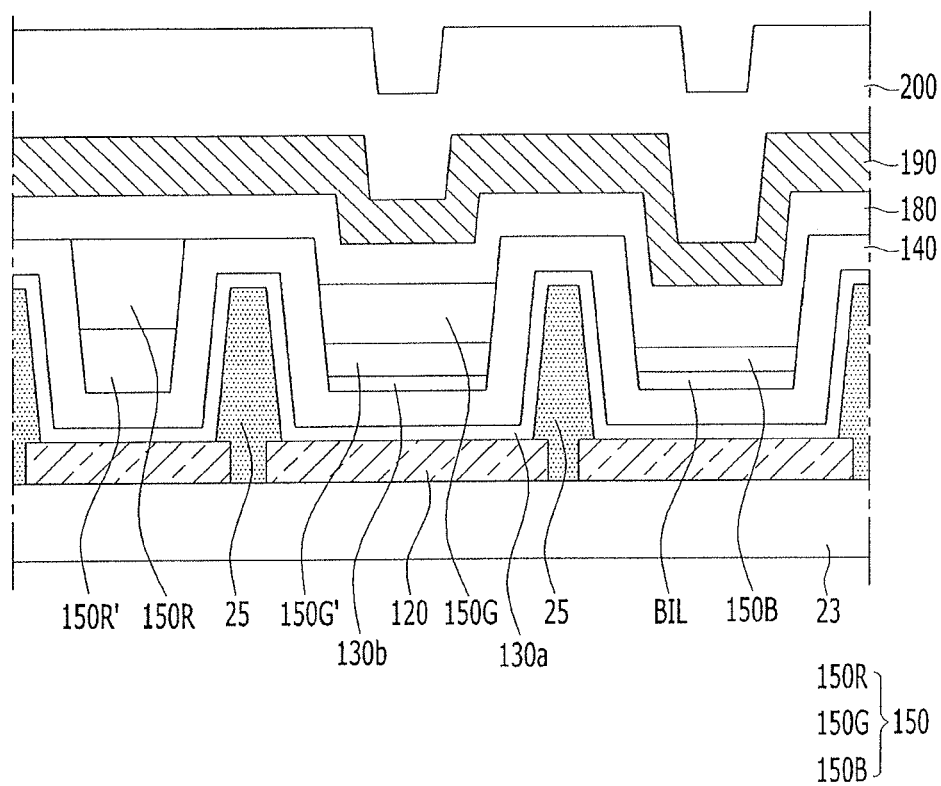
FIG. 4 illustrates an embodiment of a display device.

FIG. 4 illustrates a cross-sectional view of an embodiment of a light emitting diode display including an emission layer corresponding to the embodiment of FIG. 1. In FIG. 4, a light emitting diode respectively corresponding to the red pixel, the green pixel, and the blue pixel is on a substrate 23.

Referring to FIG. 4, the emission layer 150 of FIG. 1 includes a red emission layer 150R, a green emission layer 150G, and a blue emission layer 150B. These layers are disposed horizontally in a direction parallel to the first electrode 120. The first hole injection layer 130*a* and the hole transporting layer 140 are commonly positioned between the red emission layer 150R and the first electrode 120, between the green emission layer 150G and the first electrode 120, and between the blue emission layer 150B and the first electrode 120. The thickness of the first hole injection layer 130*a* may be substantially the same. The thickness of the hole transporting layer 140 may be substantially the same on the commonly-positioned part. The description related to the material in the first hole injection layer 130*a* and the hole transporting layer 140 may be as described in FIG. 1.

A pixel definition layer 25 may be between the red emission layer 150R, the green emission layer 150G, and the blue emission layer 150B adjacent to each other. In the green light emission region, the second hole injection layer 130*b* is on the hole transporting layer 140. The description in FIG. 1 may be applied to the description related to the material in the second hole injection layer 130*b*. The second hole injection layer 130*b* may be between the adjacent pixel definition layers 25.

In the present exemplary embodiment, an auxiliary layer BIL may be under the blue emission layer 150B to increase efficiency of the blue emission layer 150B. The auxiliary layer BIL may increase the efficiency of the blue emission layer 150B by controlling hole charge balance. The auxiliary layer BIL may include a compound represented by Chemical Formula 1.

Chemical Formula 1

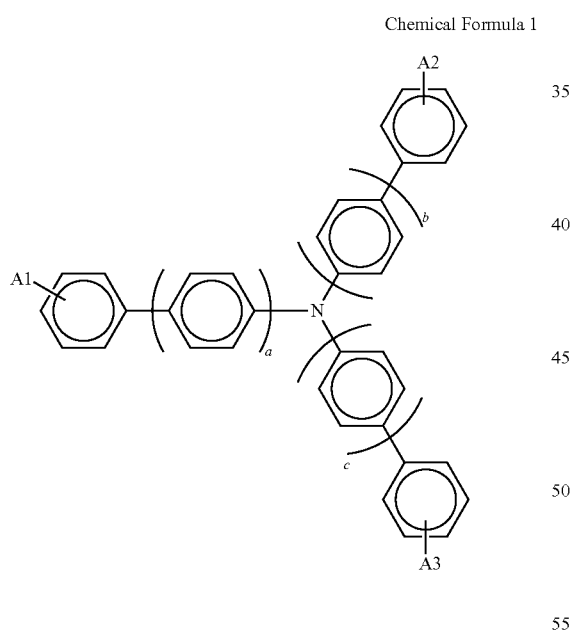

In Chemical Formula 1, A1, A2, and A3 may be an alkyl group, an aryl group, carbazole, dibenzothiophene, dibenzofuran (DBF), and biphenyl, respectively. Also, a, b, and c are independently positive numbers of zero to four.

The following Chemical Formulas 1-1, 1-2, 1-3, 1-4, 1-5, and 1-6 may be examples of the compounds represented by Chemical Formula 1.

Chemical Formula 1-1

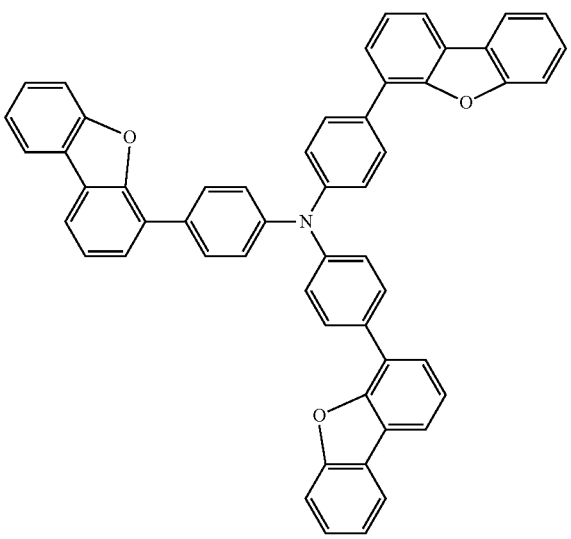

Chemical Formula 1-2

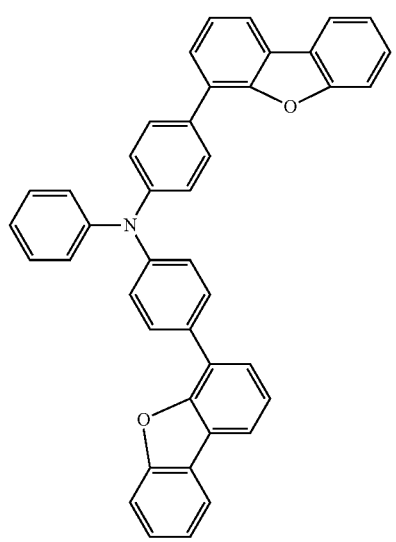

Chemical Formula 1-3

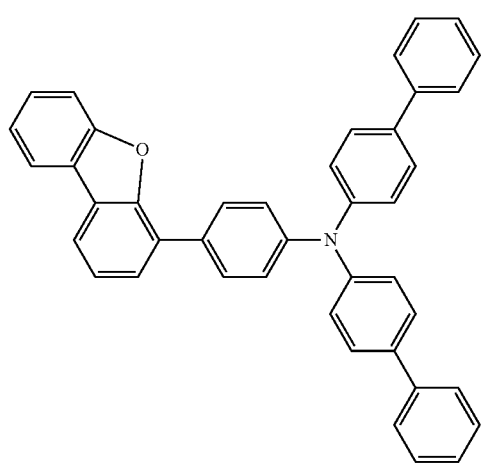

-continued

Chemical Formula 1-4

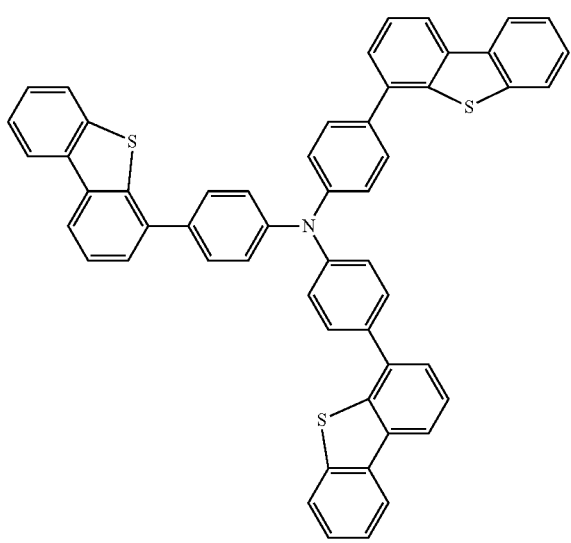

Chemical Formula 1-5

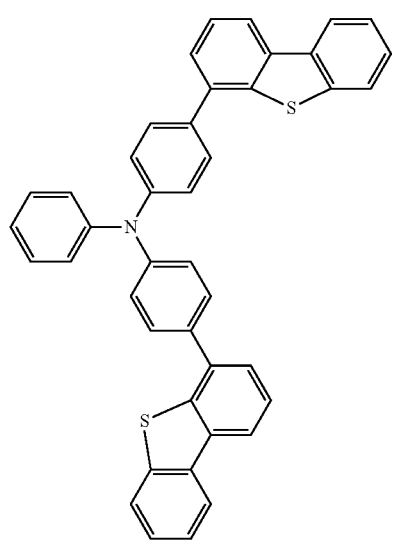

Chemical Formula 1-6

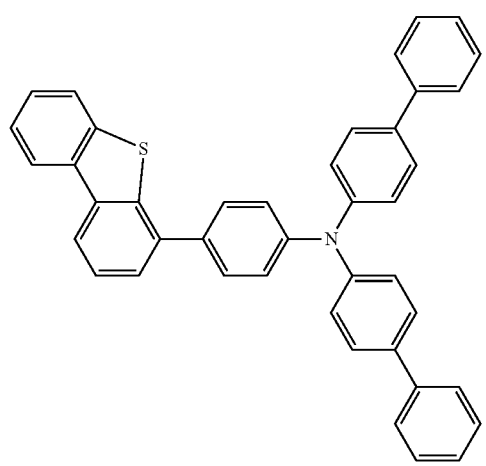

In another exemplary embodiment, the assistant layer B-L may include a compound represented by Chemical Formula 2.

Chemical Formula 2

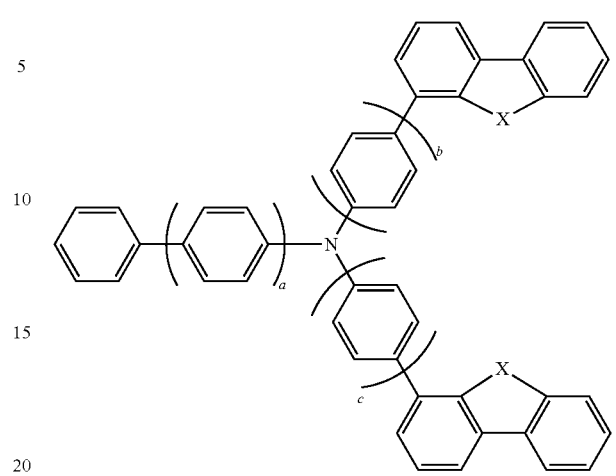

In Chemical Formula 2, a, b, and c may independently be 0 to 3, X may be selected from O, N, and S, and each X may be the same as or different from each other.

As an example of the compound represented by Chemical Formula 2, Chemical Formulas 2-1, 2-2, 2-3, 2-4, and 2-5 may be included.

Chemical Formula 2-1

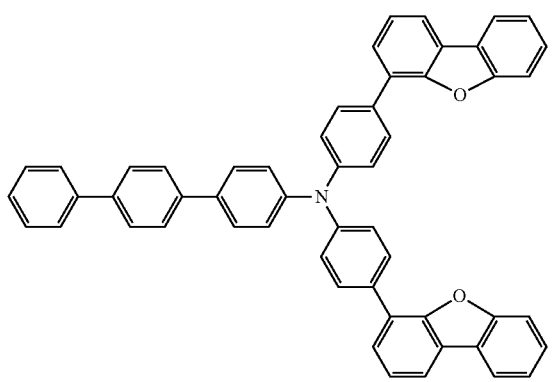

Chemical Formula 2-2

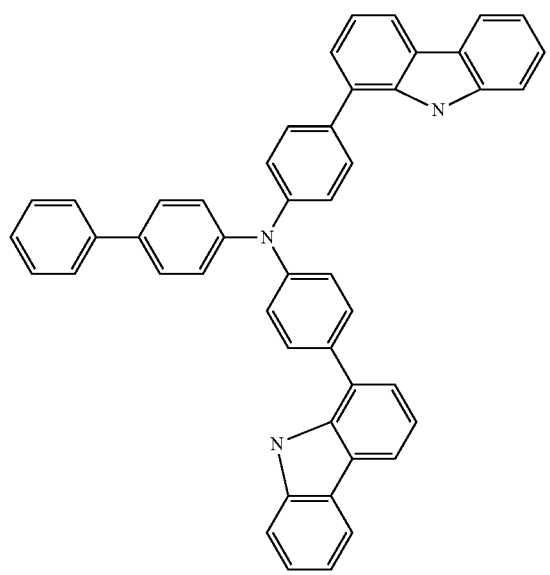

Chemical Formula 2-3

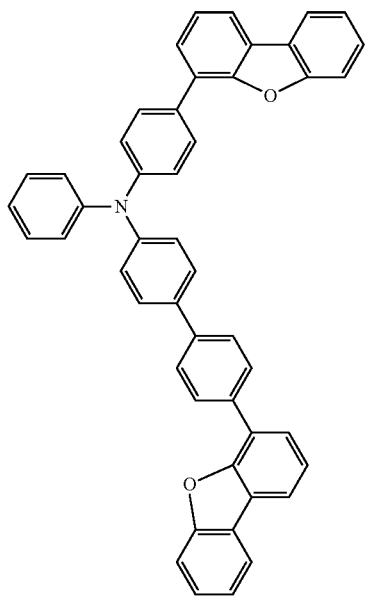

Chemical Formula 2-5

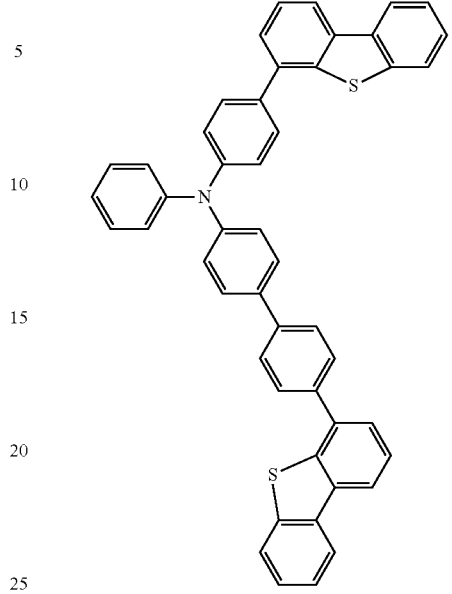

In another exemplary embodiment, the auxiliary layer (BIL) may include a compound represented by Chemical Formula 3.

Chemical Formula 3

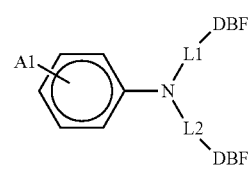

Chemical Formula 2-4

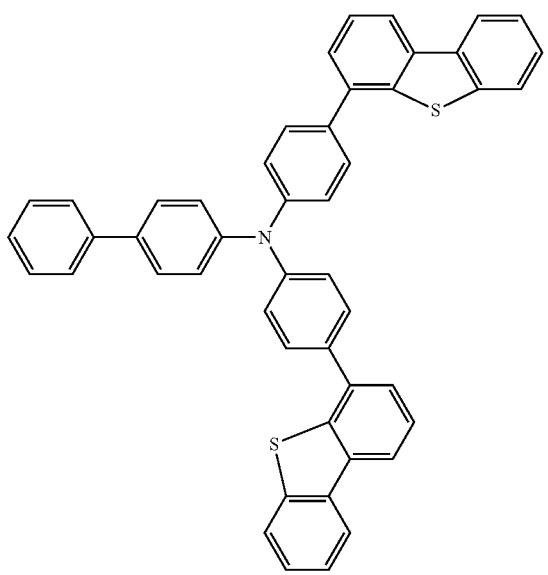

In Chemical Formula 3, A1 may be an alkyl group, an aryl group, carbazole, dibenzothiophene, or dibenzofuran (DBF), L1 and L2 may be

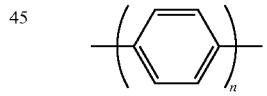

(wherein n is 0 to 3), and DBF connected to L1 and L2 may be replaced by carbazole or dibenzothiophene.

In the light emitting diode according to the present exemplary embodiment, a red resonance auxiliary layer 150R' may be under the red emission layer 150R. A green resonance auxiliary layer 150G' may be under the green emission layer 150G. The red resonance auxiliary layer 150R' and the green resonance auxiliary layer 150G' are added to control a resonance distance for each color. In one embodiment, a separate resonance auxiliary layer between the blue emission layer 150B and the auxiliary layer BIL, and the hole transport layer 140, may not be formed under the blue emission layer 150B and the auxiliary layer BIL. The green resonance auxiliary layer 150G' may correspond to the second hole transporting layer 140b described in FIG. 1.

The electron injection layer 180 and the second electrode 190 are commonly positioned between the red emission layer 150R and the capping layer 200, between the green emission layer 150G and the capping layer 200, and between the blue emission layer 150B and the capping layer 200. The thickness of the electron injection layer 180 and the second electrode 190 may be substantially the same in the commonly positioned portion. The electron transporting layer 160a and the buffer layer 160b of FIG. 1 are not in FIG. 4. However, they may be applied to the exemplary embodiment of FIG. 4.

The thin film transistor, the element including the interlayer insulating layer, and the insulating layer may be between the substrate 23 and the first electrode 120 that are shown in FIG. 4.

Figure 5:
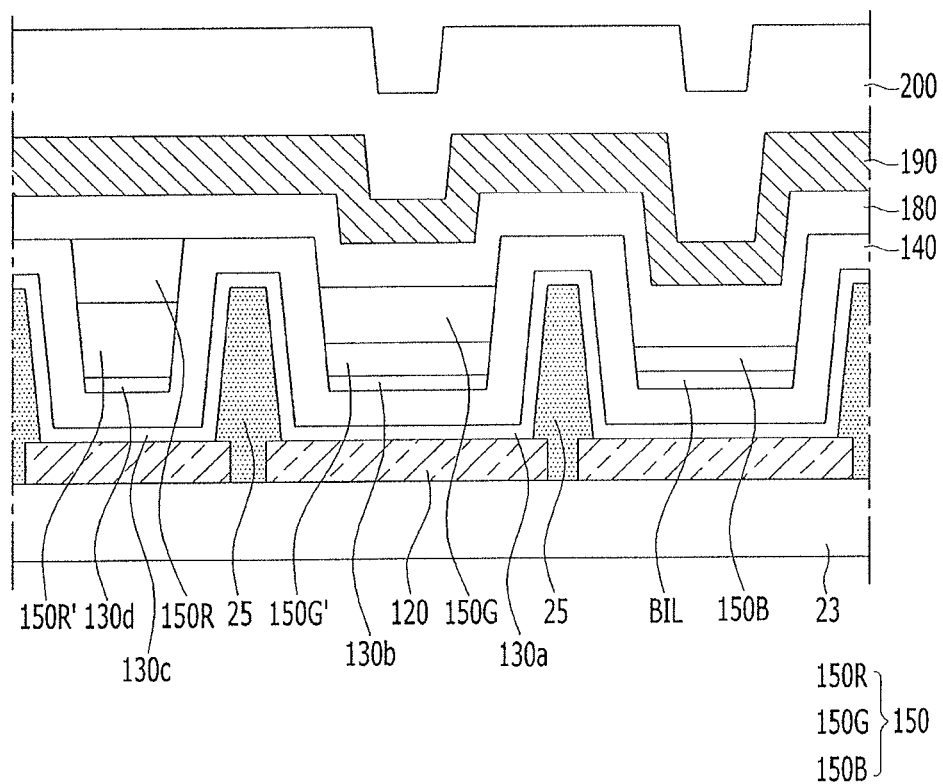
FIG. 5 illustrates another embodiment of a light emitting diode.

FIG. 5 illustrates a cross-sectional view of another embodiment of a light emitting diode. 4. The exemplary embodiment of FIG. 5 may be the same as the light emitting diode described in FIG. 4, except for the following differences.

Referring to FIG. 5, the light emitting diode in the red light emission region further includes a third hole injection layer 130c and a fourth hole injection layer 130d that are formed by respectively extending the first hole injection layer 130a and the second hole injection layer 130b in the green light emission region. The description related to the first hole injection layer 130a and the second hole injection layer 130b may be applied to the description related to the third hole injection layer 130c and the fourth hole injection layer 130d as it is.

A driving voltage and light efficiency in the blue light emitting diode will be described with reference to Table 5. The driving voltage and the light efficiency in the green light emitting diode will be described with reference to Table 6.

In Table 5, Comparative Example 1 represents the blue light emitting diode configured of the first electrode made of ITO/Ag/ITO and having a 100 Å thickness, the hole injection layer of two kinds of organic materials are mixed and having a 100 Å thickness, the hole transporting layer including one kind of organic material and having a 1080 Å thickness, the emission layer of a 190 Å thickness, the electron transporting layer of which two kinds of organic materials are mixed and has a 310 Å thickness, the electron injection layer made of Yb and having a 13 Å thickness, the second electrode made of AgMg and having a 90 Å thickness, and the capping layer including the organic material.

Experimental Example 1 has the same configuration as most of Comparative Example 1, but represents the blue light emitting diode including the hole injection layer in which the organic material is doped with 6 vol % CuI. Experimental Example 2 has the same configuration as most of Comparative Example 1, but represents the blue light emitting diode including the hole injection layer in which the organic material is doped with 4 vol % CuI and the electron injection layer in which Yb is doped with 3 vol % KI. Experimental Example 3 has the same configuration as most of Comparative Example 1, but represents the blue light emitting diode including the hole injection layer in which the organic material is doped with 6 vol % CuI and the electron injection layer in which Yb is doped with 3 vol % KI. Experimental Example 4 has the same configuration as most of Comparative Example 1, but represents the blue light emitting diode including the hole injection layer in which the organic material is doped with 6 vol % CuI and the electron injection layer in which Yb is doped with 6 vol % KI.

TABLE 5

| | Driving voltage (V) | B efficiency (cd/A) |
|---|---|---|
| Comparative Example 1 | 4.0 | 180.5 |
| Experimental Example 1 | 3.7 | 183.3 |
| Experimental Example 2 | 3.6 | 187.9 |
| Experimental Example 3 | 3.6 | 185.7 |
| Experimental Example 4 | 3.5 | 198.6 |

In Table 6, Comparative Example 2 represents the green light emitting diode configured of the first electrode made of ITO/Ag/ITO and having a 100 Å thickness, the first hole injection layer of which two kinds of organic materials are mixed and has a 100 Å thickness, the first hole transporting layer including one kind of organic material and having the 1075 Å thickness, the second hole injection layer of which two kinds of organic materials are mixed and has the 100 Å thickness, the second hole transporting layer including one kind of organic material and having the 200 Å thickness, the emission layer of the 380 Å thickness, the electron transporting layer of which two kinds of organic materials are mixed and having the 310 Å thickness, the electron injection layer made of Yb and having the 13 Å thickness, the second electrode made of AgMg and having the 100 Å thickness, and the capping layer including the organic material.

Experimental Example 5 has the same configuration as most of Comparative Example 2, but represents the green light emitting diode including the first hole injection layer in which the organic material is doped with 4 vol % CuI. Experimental Example 6 has the same configuration as most of Comparative Example 2, but represents the green light emitting diode including the first hole injection layer of which the organic material is doped with 6 vol % CuI. Experimental Example 7 has the same configuration as most of Comparative Example 2, but represents the green light emitting diode including the first hole injection layer of which the organic material is doped with 8 vol % CuI.

Experimental Example 8 has the same configuration as most of Comparative Example 2, but represents the green light emitting diode including the second hole injection layer of which the organic material is doped with 2 vol % CuI. Experimental Example 9 has the same configuration as most of Comparative Example 2, but represents the green light emitting diode including the second hole injection layer in which the organic material is doped with 4 vol % CuI. Experimental Example 10 has the same configuration as most of Comparative Example 2, but represents the green light emitting diode including the second hole injection layer in which the organic material is doped with 6 vol % CuI. Experimental Example 11 has the same configuration as most of Comparative Example 2, but represents the green light emitting diode including the second hole injection layer in which the organic material is doped with 8 vol % CuI.

Experimental Example 12 has the same configuration as most of Comparative Example 2, but represents the green light emitting diode including the first hole injection layer in which the organic material is doped with 2 vol % CuI and the electron injection layer in which Yb is doped with 10 vol % KI. Experimental Example 13 has the same configuration as most of Comparative Example 2, but represents the green light emitting diode including the first hole injection layer in which the organic material is doped with 4 vol % CuI and the electron injection layer in which Yb is doped with 10 vol % KI.

Experimental Example 14 has the same configuration as most of Comparative Example 2, but represents the green light emitting diode including the first hole injection layer in which the organic material is doped with 6 vol % CuI and the electron injection layer in which Yb is doped with 10 vol % KI. Experimental Example 15 has the same configuration as most of Comparative Example 2, but represents the green light emitting diode including the first hole injection layer in which the organic material is doped with 8 vol % CuI and the electron injection layer in which Yb is doped with 10 vol % KI.

Experimental Example 16 has the same configuration as most of Comparative Example 2, but represents the green light emitting diode including the second hole injection layer in which the organic material is doped with 2 vol % CuI and the electron injection layer in which Yb is doped with 10 vol % KI. Experimental Example 17 has the same configuration as most of Comparative Example 2, but represents the green light emitting diode including the second hole injection layer in which the organic material is doped with 4 vol % CuI and the electron injection layer in which Yb is doped with 10 vol % KI. Experimental Example 18 has the same configuration as most of Comparative Example 2, but represents the green light emitting diode including the second hole injection layer in which the organic material is doped with 6 vol % CuI and the electron injection layer in which Yb is doped with 10 vol % KI. Experimental Example 19 has the same configuration as most of Comparative Example 2, but represents the green light emitting diode including the second hole injection layer in which the organic material is doped with 8 vol % CuI and the electron injection layer in which Yb is doped with 10 vol % KI.

Experimental Example 20 has the same configuration as most of Comparative Example 2, but represents the green light emitting diode including the first hole injection layer made of CuI and the electron injection layer in which Yb is doped with 10 vol % KI. Experimental Example 21 has the same configuration as most of Comparative Example 2, but represents the green light emitting diode including the second hole injection layer made of CuI and the electron injection layer in which Yb is doped with 10 vol % KI. Experimental Example 22 has the same configuration as most of Comparative Example 2, but represents the green light emitting diode including the first hole injection layer made of CuI, the second hole injection layer made of CuI, and the electron injection layer in which Yb is doped with 10 vol % KI.

Experimental Example 23 has the same configuration as most of Comparative Example 2, but represents the green light emitting diode including the first hole injection layer in which the organic material is doped with 6 vol % CuI, the second hole injection layer in which the organic material is doped with 6 vol % CuI, and the electron injection layer in which Yb is doped with 10 vol % KI.

TABLE 6

|  | Driving voltage (V) | G efficiency (cd/A) |
| --- | --- | --- |
| Comparative Example 2 | 4.2 | 133.4 |
| Experimental Example 5 | 3.8 | 145.7 |
| Experimental Example 6 | 3.8 | 142.5 |
| Experimental Example 7 | 3.8 | 142.2 |
| Experimental Example 8 | 3.8 | 142.4 |
| Experimental Example 9 | 3.7 | 143.1 |
| Experimental Example 10 | 3.7 | 146.2 |
| Experimental Example 11 | 3.7 | 146.7 |
| Experimental Example 12 | 3.9 | 147.1 |
| Experimental Example 13 | 3.9 | 148.8 |
| Experimental Example 14 | 3.9 | 149 |
| Experimental Example 15 | 3.8 | 149.5 |
| Experimental Example 16 | 3.7 | 145.7 |

TABLE 6-continued

|  | Driving voltage (V) | G efficiency (cd/A) |
| --- | --- | --- |
| Experimental Example 17 | 3.6 | 145.9 |
| Experimental Example 18 | 3.6 | 150.8 |
| Experimental Example 19 | 3.6 | 149.5 |
| Experimental Example 20 | 3.9 | 148.9 |
| Experimental Example 21 | 3.6 | 146.8 |
| Experimental Example 22 | 3.7 | 147.8 |
| Experimental Example 23 | 3.7 | 149.8 |

Referring to Table 5 and Table 6, compared with Comparative Examples 1 and 2, in the case of Experimental Example 1 to Experimental Example 23, the driving voltage decreases, and the blue light efficiency or the green light efficiency increases. For the red light emitting diode, experimental data is not attached, however an experimental result of the same tendency as the green light emitting diode may be obtained.

Figure 6:
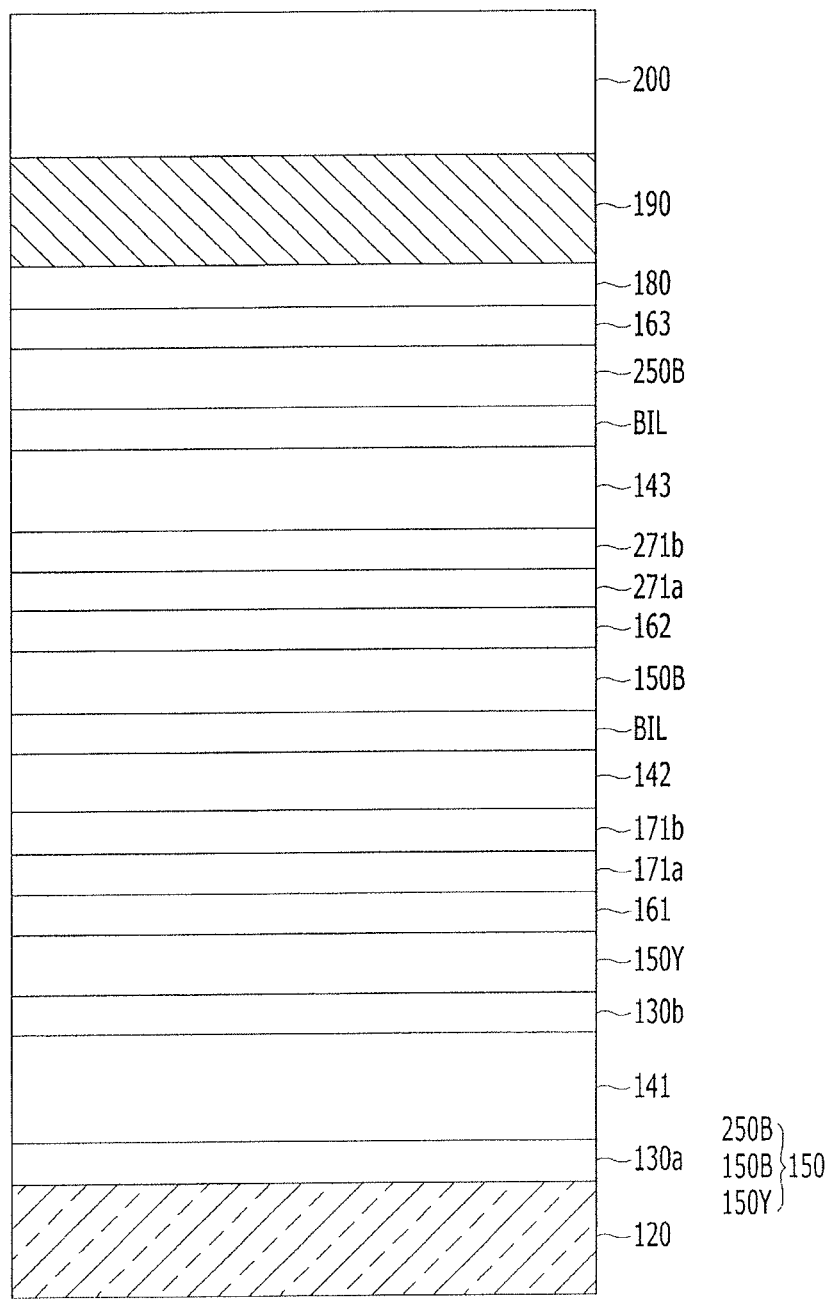
FIG. 6 illustrates another embodiment of a light emitting diode.

FIG. 6 illustrates a cross-sectional view of another embodiment of a light emitting diode having a tandem structure. FIG. 6 has the same configuration as most of the light emitting diode described in FIG. 1, except for the following differences.

Referring to FIG. 6, the light emitting diode according to the present exemplary embodiment includes the first electrode 120, the second electrode 190, and the emission layer 150 emitting white light or blue light by combining a plurality of layers 150Y, 150B, and 250B between the first electrode 120 and the second electrode 190. The plurality of layers may have a structure in which two or three layers are deposited, and the emission layer 150 of three layers is shown in FIG. 6.

The light generated from the emission layer 150 may realize the desired color while passing through a color convention layer on the second electrode 190. In one embodiment, a plurality of color conversion layers may be formed to correspond to respective pixel areas. The color conversion layers may be, for example, red, green, and blue color filters including a dye or a pigment, and may include nanoparticles having different sizes, e.g., quantum dots. When the emission layer 150 emits blue light, the blue color filter may be omitted or the transmission layer may be formed at a portion corresponding to the blue pixel area instead of the color conversion layer. As a result, blue light generated from the emission layer 150 may be transmitted as it is. Like the case where layers 150Y, 150B, and 250B are combined to emit blue light, a light emitting diode structure may be formed based on a combination of the emission layer emitting blue light as a single layer and the color conversion layer.

The three layers of the emission layer 150 may respectively represent blue, yellow, and blue. Two layers of the emission layer may respectively represent blue and yellow. Also, n-type charge generation layers 171a and 271a and p-type charge generation layers 171b and 271b may be between layers adjacent to each other, among layers 150Y, 150B, and 250B of FIG. 6. The n-type charge generation layers 171a and 271a may include an organic material doped with a lanthanum element. The p-type charge generation layers 171b and 271b may include inorganic dipole material. The inorganic dipole material may be applied with the contents related to the inorganic dipole material including the first hole injection layer 130a or the second hole injection layer 130b described with reference to FIG. 1. The inorganic dipole material in the p-type charge generation layers 171b and 271b may be the same as the inorganic dipole material in the first hole injection layer 130a or the second hole injection layer 130b.

Referring to FIG. 6, the first hole injection layer 130a and the second hole injection layer 130b are respectively under and on a first hole transporting layer 141. The first emission layer 150Y is on the second hole injection layer 130b. A first electron transporting layer 161 is on the first emission layer 150Y. The charge generation layers 171a and 171b are on the first electron transporting layer 161. A second hole transporting layer 142 is on the charge generation layers 171a and 171b. A blue light emission auxiliary layer BIL is between the second hole transporting layer 142 and the second emission layer 150B. A second electron transporting layer 162 is on the second emission layer 150B.

The charge generation layers 271a and 271b are on the second electron transporting layer 162. A third hole transporting layer 143 is on the charge generation layers 271a and 271b. A blue light emission auxiliary layer BIL is between the third hole transporting layer 143 and the third emission layer 250B. A third electron transporting layer 163 is on the third emission layer 250B. The capping layer 200 is on the second electrode 190.

Figure 7:
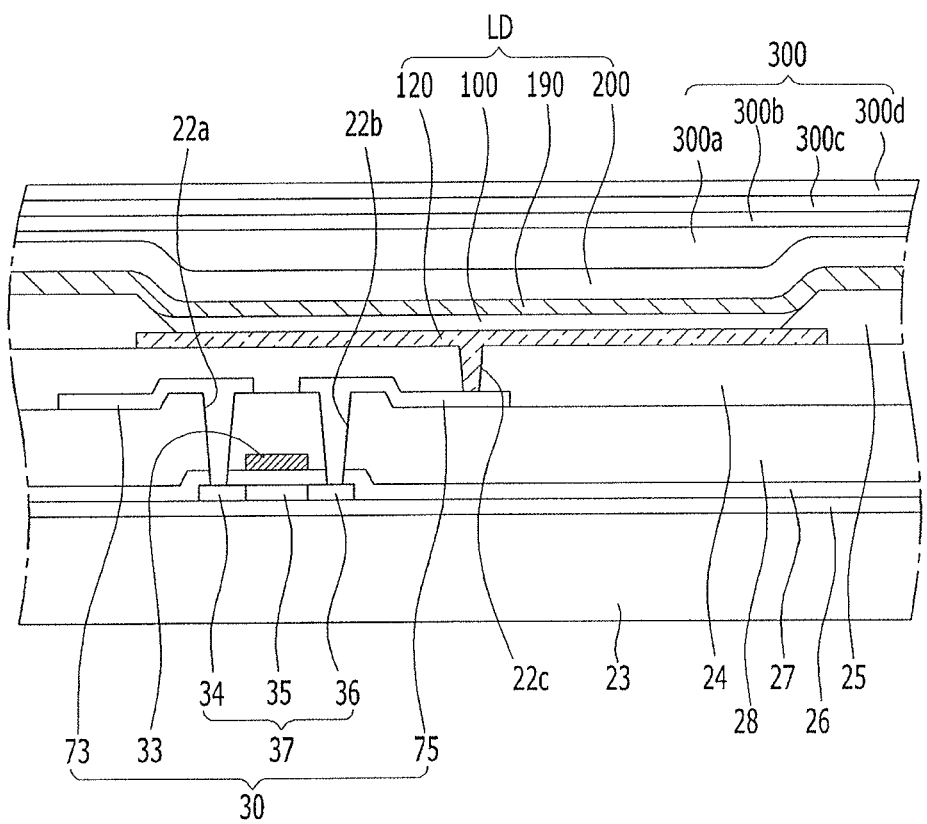
FIG. 7 illustrates another embodiment of a display device.

FIG. 7 illustrates a cross-sectional view of another embodiment of a display device which includes a substrate 23, a driving transistor 30, a first electrode 120, a light emitting diode layer 100, and a second electrode 190. The first electrode 120 may be an anode and the second electrode 190 may be a cathode, or the first electrode 120 may be a cathode and the second electrode 190 may be an anode.

A substrate buffer layer 26 may be on the substrate 23 and may prevent penetration of impure elements and planarize the surface. In one embodiment, the substrate buffer layer 26 may be omitted, for example, according to the type and/or process conditions of the substrate 23.

A driving semiconductor layer 37 is on the substrate buffer layer 26 and may be formed, for example, of a material including a polysilicon. The driving semiconductor layer 37 includes a channel region 35 not doped with an impurity, and a source region 34 and a drain region 36 doped with an impurity and formed at respective sides of the channel region 35. The doped ion materials may be p-type impurities, e.g., boron (B) or $B_2H_6$. The impurities depend, for example, on the type of the thin film transistor.

A gate insulating layer 27 is on the driving semiconductor layer 37. A gate wire including a driving gate electrode 33 is on the gate insulating layer 27. The driving gate electrode 33 overlaps at least a portion of the driving semiconductor layer 37, and, for example, the channel region 35.

An interlayer insulating layer 28 covering the gate electrode 33 is on the gate insulating layer 27. A first contact hole 22a and a second contact hole 22b respectively expose the source region 34 and the drain region 36 of the driving semiconductor layer 37 and are formed in the gate insulating layer 27 and the interlayer insulating layer 28. A data wire (including a driving source electrode 73 and a driving drain electrode 75) may be on the interlayer insulating layer 28. The driving source electrode 73 and the driving drain electrode 75 are connected to the source region 34 and the drain region 36 of the driving semiconductor layer 37 through the first contact hole 22a and the second contact hole 22b formed in the interlayer insulating layer 28 and the gate insulating layer 27, respectively.

The driving thin film transistor 30 is formed to include the driving semiconductor layer 37, the driving gate electrode 33, the driving source electrode 73, and the driving drain electrode 75. The driving thin film transistor 30 may have a different configuration in another embodiment.

A planarization layer 24 covering the data wire is on the interlayer insulating layer 28. The planarization layer 24 serves to remove and planarize a step in order to increase emission efficiency of the light emitting diode to be formed thereon. The planarization layer 24 has a third contact hole 22c to electrically connect the driving drain electrode 75 and the first electrode 120 that is described later. In one embodiment, the planarization layer 24 or the interlayer insulating layer 28, or both, may be omitted.

The first electrode 120 of the light emitting diode LD is on the planarization layer 24. The pixel definition layer 25 is on the planarization layer 24 and the first electrode 120. The pixel definition layer 25 has an opening overlapping a part of the first electrode 120. In this case, the light emitting diode layer 100 may be positioned for each opening formed in the pixel definition layer 25.

The light emitting diode layer 100 is on the first electrode 120 and corresponds to the first hole injection layer 130a, the first hole transporting layer 140a, the second hole injection layer 130b, the second hole transporting layer 140b, the emission layer 150, the electron transporting layer 160, and the electron injection layer 180 in the light emitting diode described in FIG. 1. Other features of the light emitting diode of FIGS. 4 and 6 may be included the display device of the present embodiment.

In FIG. 7, the light emitting diode layer 100 is only positioned in the opening of the pixel definition layer 25. However, as shown in FIG. 4, partial layers configuring the light emitting diode layer 100 may also be on the upper surface of the pixel definition layer 25, like the second electrode 190.

A second electrode 190 and a capping layer 200 are on the light emitting diode layer 100.

A thin film encapsulation layer 300 is on the capping layer 200 and encapsulates the light emitting diode LD formed on the substrate 23 and a driving circuit to protect them from the outside. The thin film encapsulation layer 300 includes organic encapsulation layers 300a and 300c and inorganic encapsulation layers 300b and 300d that are alternately deposited one-by-one. In FIG. 7, the thin film encapsulation layer 300 is configured by alternately depositing two organic encapsulation layers 300a and 300c and two inorganic encapsulation layers 300b and 300d one-by-one. These layers may be deposited in a different manner in another embodiment.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:
1. A light emitting diode, comprising:
a first electrode overlapping a second electrode;
an emission layer between the first and second electrodes;
a charge generation layer between a plurality of layers of the emission layer; and
a first hole injection layer between the first electrode and the emission layer, wherein the first hole injection layer includes an inorganic dipole material and an organic material, and wherein the charge generation layer includes the inorganic dipole material, and wherein the inorganic dipole material in the charge generation layer and the inorganic dipole material in the first hole injection layer are same.

2. The light emitting diode as claimed in claim 1, wherein the inorganic dipole material includes at least one of CuI, AgI, AuI, $ZnI_2$, $NiI_2$, $PdI_2$, $PtI_2$, $CoI_2$, $RhI_2$, $IrI_2$, $FeI_2$, $RuI_2$, $IrI_2$, $FeI_2$, $RuI_2$, $OsI_2$, $MnI_2$, $TcI_2$, $ReI_2$, $CrI_3$, $MoI_3$, $WI_3$, $VI_3$, $NbI_3$, $TaI_3$, $TiI_4$, $ZrI_4$, $HfI_4$, $SnI_2$, $SnI_4$, $GeI_2$, $GeI_4$, CuBr, AgBr, AuBr, $ZnBr_2$, $PdBr_2$, $PtBr_2$, $CoBr_2$, $RhBr_2$, $IrBr_2$, $FeBr_2$, $RuBr_2$, $OsBr_2$, $MnBr_2$, $TcBr_2$, $ReBr_2$, $CrBr_3$, $MoBr_3$, $WBr_3$, $VBr_3$, $NbBr_3$, $TaBr_3$, $TiBr_4$, $ZrBr_4$, $HfBr_4$, CuCl, AgCl, AuCl, $ZnCl_2$, $PdCl_2$, $PtCl_2$, $CoCl_2$, $RhCl_2$, $IrCl_2$, $FeCl_2$, $RuCl_2$, $OsCl_2$, $MnCl_2$, $TcCl_2$, $ReCl_2$, $CrCl_3$, $MoCl_3$, $WCl_3$, $VCl_3$, $NbCl_3$, $TaCl_3$, $TiCl_4$, $ZrCl_4$, $HfCl_4$, CuF, AgF, AuF, $ZnF_2$, $PdF_2$, $PtF_2$, $CoF_2$, $RhF_2$, $IrF_2$, $FeF_2$, $RuF_2$, $OsF_2$, $MnF_2$, $TcF_2$, $ReF_2$, $CrF_3$, $MoF_3$, $WF_3$, $VF_3$, $NbF_3$, $TaF_3$, $TiF_4$, $ZrF_4$, $HfF_4$, or $BiI_3$.

3. The light emitting diode as claimed in claim 1, wherein the emission layer is to emit blue light by combining the plurality of layers.

4. The light emitting diode as claimed in claim 3, wherein at least one layer of the plurality of layers emits blue.

5. The light emitting diode as claimed in claim 3, wherein at least two layers of the plurality of layers emit blue.

6. The light emitting diode as claimed in claim 3, wherein some layers of the plurality of layers emit same color light.

7. The light emitting diode as claimed in claim 1, wherein the charge generation layer and the first hole injection layer include same material.

8. The light emitting diode as claimed in claim 1, further comprising:
   an electron injection layer between the emission layer and the second electrode, and
   wherein the electron injection layer includes at least one of a lanthanum element, a first element of an alkali metal, a second element of a halogen, and compound thereof.

9. The light emitting diode as claimed in claim 8, wherein the electron injection layer includes at least one of Yb, KI and KI:Yb.

10. The light emitting diode as claimed in claim 8, wherein the electron injection layer includes at least one of:
   a) a dipole material having the lanthanum element and the second element having different polarities, b) a first compound made of the lanthanum element, the first element, and the second element and having a perovskite structure, c) a positive ion of the first element, or d) a monomolecular molecule including the lanthanum element.

11. The light emitting diode as claimed in claim 1, wherein the inorganic dipole material includes at least one of Fluoride, Chloride, Iodide or Bromide.

12. A display device, comprising:
   a substrate;
   a plurality of transistors on the substrate; and
   a first light emitting diode, a second light emitting diode, and a third light emitting diode respectively connected to the plurality of transistors, wherein each of the first light emitting diode, the second light emitting diode, and the third light emitting diode includes a first electrode, a second electrode overlapping the first electrode, an emission layer between the first electrode and the second electrode, and a hole injection layer between the first electrode and the emission layer,
   wherein:
   the first light emitting diode includes a first hole injection layer between the first electrode and the second electrode, and
   the first hole injection layer includes an inorganic dipole material and an organic material.

13. The display device as claimed in claim 12, wherein:
   the substrate includes a red light emission region, a green light emission region, and a blue light emission region, and
   the first light emitting diode is in the green light emission region.

14. The display device as claimed in claim 13, wherein:
   the second light emitting diode is in the red light emission region,
   the second light emitting diode includes a second hole injection layer between the first electrode and the second electrode, and
   the second hole injection layer includes an inorganic dipole material, and an organic material.

15. The display device as claimed in claim 14, wherein:
   the third light emitting diode is in the blue light emission region, and
   the third light emitting diode includes an auxiliary layer under an emission layer of the third light emitting diode.

16. The display device as claimed in claim 14, further comprising:
   a green resonance auxiliary layer under the emission layer of the first light emitting diode, and
   a red resonance auxiliary layer under the emission layer of the second light emitting diode.

17. The display device as claimed in claim 12, wherein the inorganic dipole material includes at least one of CuI, AgI, AuI, $ZnI_2$, $NiI_2$, $PdI_2$, $PtI_2$, $CoI_2$, $RhI_2$, $IrI_2$, $FeI_2$, $RuI_2$, $IrI_2$, $FeI_2$, $RuI_2$, $OsI_2$, $MnI_2$, $TcI_2$, $ReI_2$, $CrI_3$, $MoI_3$, $WI_3$, $VI_3$, $NbI_3$, $TaI_3$, $TiI_4$, $ZrI_4$, $HfI_4$, $SnI_2$, $SnI_4$, $GeI_2$, $GeI_4$, CuBr, AgBr, AuBr, $ZnBr_2$, $PdBr_2$, $PtBr_2$, $CoBr_2$, $RhBr_2$, $IrBr_2$, $FeBr_2$, $RuBr_2$, $OsBr_2$, $MnBr_2$, $TcBr_2$, $ReBr_2$, $CrBr_3$, $MoBr_3$, $WBr_3$, $VBr_3$, $NbBr_3$, $TaBr_3$, $TiBr_4$, $ZrBr_4$, $HfBr_4$, CuCl, AgCl, AuCl, $ZnCl_2$, $PdCl_2$, $PtCl_2$, $CoCl_2$, $RhCl_2$, $IrCl_2$, $FeCl_2$, $RuCl_2$, $OsCl_2$, $MnCl_2$, $TcCl_2$, $ReCl_2$, $CrCl_3$, $MoCl_3$, $WCl_3$, $VCl_3$, $NbCl_3$, $TaCl_3$, $TiCl_4$, $ZrCl_4$, $HfCl_4$, CuF, AgF, AuF, $ZnF_2$, $PdF_2$, $PtF_2$, $CoF_2$, $RhF_2$, $IrF_2$, $FeF_2$, $RuF_2$, $OsF_2$, $MnF_2$, $TcF_2$, $ReF_2$, $CrF_3$, $MoF_3$, $WF_3$, $VF_3$, $NbF_3$, $TaF_3$, $TiF_4$, $ZrF_4$, $HfF_4$, or $BiI_3$.

18. The display device as claimed in claim 12, further comprising: an electron injection layer between the emission layer and the second electrode, and wherein the electron injection layer includes at least one of a lanthanum element, a first element of an alkali metal, a second element of a halogen, and compound thereof.

19. The display device as claimed in claim 18, wherein the electron injection layer includes at least one of:
   a) a dipole material having the lanthanum element and the second element having different polarities,
   b) a first compound made of the lanthanum element, the first element, and the second element and having a perovskite structure,
   c) a positive ion of the first element, and
   d) a monomolecular molecule including the lanthanum element.

* * * * *